United States Patent
Tomura et al.

(10) Patent No.: US 12,412,749 B2
(45) Date of Patent: Sep. 9, 2025

(54) ETCHING METHOD AND PLASMA PROCESSING SYSTEM

(71) Applicant: Tokyo Electron Limited, Tokyo (JP)

(72) Inventors: Maju Tomura, Miyagi (JP); Yoshihide Kihara, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 307 days.

(21) Appl. No.: 18/124,593

(22) Filed: Mar. 22, 2023

(65) Prior Publication Data
US 2023/0307243 A1    Sep. 28, 2023

(30) Foreign Application Priority Data
Mar. 24, 2022   (JP) ................... 2022-048412

(51) Int. Cl.
*H01L 21/3065* (2006.01)
*H01J 37/32* (2006.01)
*H01L 21/311* (2006.01)

(52) U.S. Cl.
CPC .... *H01L 21/3065* (2013.01); *H01J 37/32449* (2013.01); *H01L 21/31116* (2013.01); *H01L 21/31144* (2013.01); *H01J 2237/334* (2013.01)

(58) Field of Classification Search
None
See application file for complete search history.

(56) References Cited

U.S. PATENT DOCUMENTS

| | | | |
|---|---|---|---|
| 6,727,129 B1 * | 4/2004 | Nakajima | H10D 84/0177 257/E21.645 |
| 2021/0143016 A1 * | 5/2021 | Yokoyama | H01J 37/32082 |

FOREIGN PATENT DOCUMENTS

| | | |
|---|---|---|
| JP | 2016-039310 A | 3/2016 |
| JP | 2022-002337 A | 1/2022 |
| JP | 2022-020007 A | 1/2022 |
| WO | 2021/011143 A1 | 1/2021 |

* cited by examiner

*Primary Examiner* — Roberts P Culbert
(74) *Attorney, Agent, or Firm* — XSENSUS LLP

(57) ABSTRACT

An etching method includes: (a) providing a substrate having a silicon-containing film and a mask on the silicon-containing film in a chamber of a plasma processing apparatus, and (b) etching the silicon-containing film by generating plasma from a processing gas containing HF gas, and $PCl_aF_b$ gas (each of a and b is an integer of 1 or more) or $PC_cH_dF_e$ gas (c is an integer of 0 or more, and each of d and e is an integer of 1 or more), in the chamber.

19 Claims, 4 Drawing Sheets

ETCHING METHOD AND PLASMA PROCESSING SYSTEM

CROSS-REFERENCE TO RELATED APPLICATIONS

This application is based on and claims priority from Japanese Patent Application No. 2022-048412 filed on Mar. 24, 2022 with the Japanese Patent Office, the disclosure of which is incorporated herein in its entirety by reference.

TECHNICAL FIELD

The present disclosure relates to an etching method and a plasma processing system.

BACKGROUND

Japanese Patent Laid-Open Publication No. 2016-039310 discloses a technique of etching a silicon-containing film.

SUMMARY

In one embodiment of the present disclosure, an etching method includes: (a) providing a substrate having a silicon-containing film and a mask on the silicon-containing film in a chamber of a plasma processing apparatus, and (b) etching the silicon-containing film by generating plasma from a processing gas containing HF gas, and $PCl_aF_b$ gas (each of a and b is an integer of 1 or more) or $PC_cH_dF_e$ gas (each of d and e is an integer of 1 or more, and c is an integer of 0 or more), in the chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
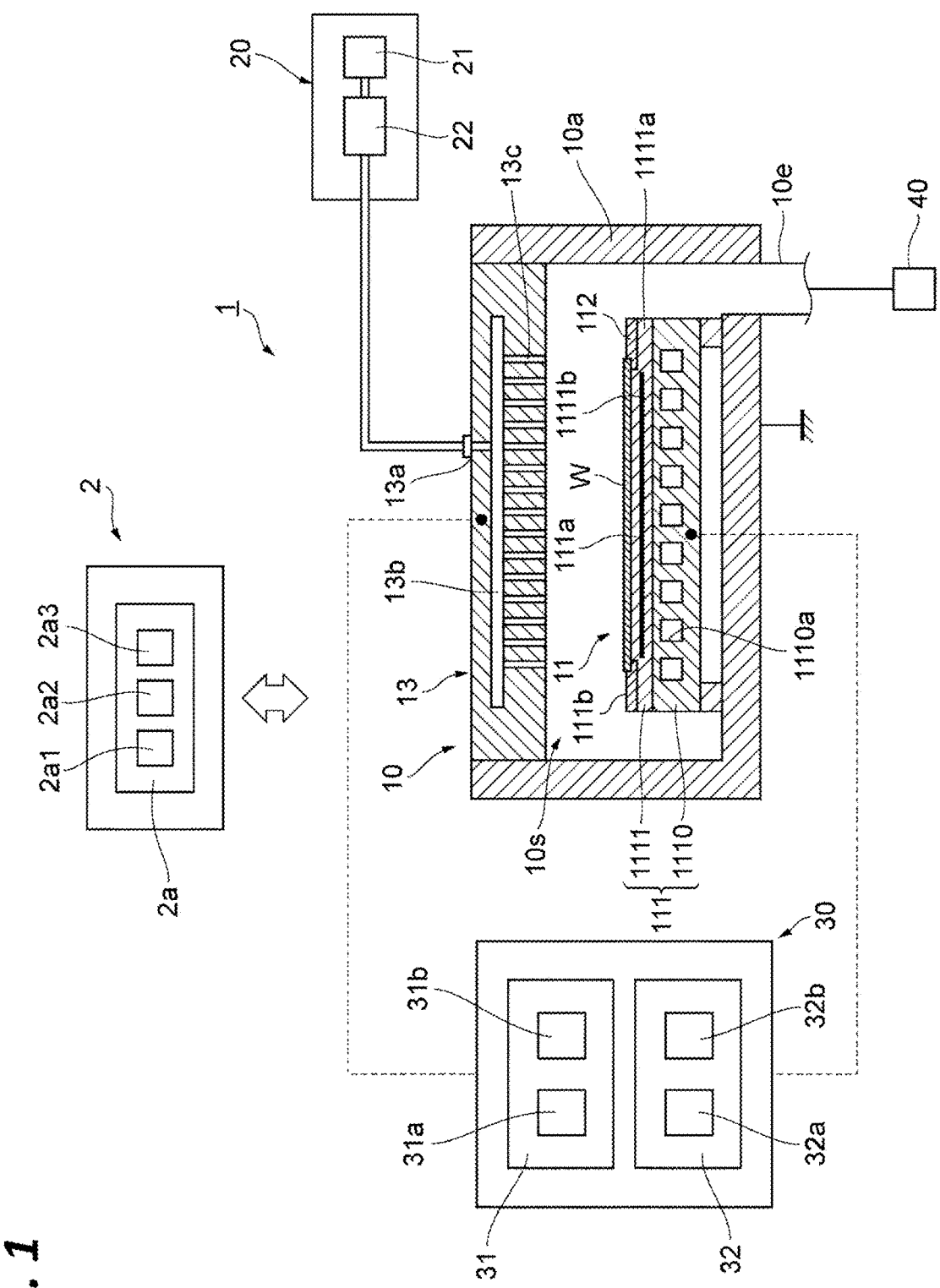
FIG. 1 is a view schematically illustrating an exemplary plasma processing system.

In the following detailed description, reference is made to the accompanying drawings, which form a part hereof. The illustrative embodiments described in the detailed description, drawings, and claims are not meant to be limiting. Other embodiments may be utilized, and other changes may be made without departing from the spirit or scope of the subject matter presented here.

Hereinafter, each embodiment of the present disclosure will be described.

In one embodiment, an etching method includes: (a) providing a substrate having a silicon-containing film and a mask on the silicon-containing film in a chamber of a plasma processing apparatus; and (b) etching the silicon-containing film by generating plasma from a processing gas containing HF gas, and $PCl_aF_b$ gas (a is an integer of 1 or more, b is an integer of 0 or more, and the sum of a and b is an integer of 5 or less) or $PC_cH_dF_e$ gas (c is an integer of 0 to 5, and each of d and e is an integer of 1 to 9), in the chamber.

In one embodiment, each of a and b of the $PCl_aF_b$ gas is an integer of 1 or more.

In one embodiment, the $PCl_aF_b$ gas includes at least one type selected from the group consisting of $PClF_2$ gas, $PCl_2F$ gas, and $PCl_2F_3$ gas.

In one embodiment, the $PC_cH_dF_e$ gas includes at least one type of gas selected from the group consisting of $PF_2CH_3$ gas, $PF(CH_3)_2$ gas, $PH_2CF_3$ gas, $PH(CF_3)_2$ gas, $PCH_3(CF_3)_2$ gas, $PH_2F$ gas, and $PF_3(CH_3)_2$ gas.

In one embodiment, in (b), a flow rate of the HF gas is highest in the processing gas supplied into the chamber, except for an inert gas.

In one embodiment, the flow rate of the HF gas is 50 vol % or more in a total flow rate of the processing gas excluding the inert gas.

In one embodiment, a flow rate of the $PCl_aF_b$ gas or the $PC_cH_dF_e$ gas is 20 vol % or less in a total flow rate of the processing gas excluding an inert gas.

In one embodiment, the processing gas further contains $C_fF_g$ gas (each of f and g is an integer of 1 or more).

In one embodiment, the processing gas further contains $C_hH_iF_j$ gas (each of h, i and j is an integer of 1 or more).

In one embodiment, the processing gas further contains $WF_6$ gas or $BCl_3$ gas.

In one embodiment, in (b), a temperature of a substrate support supporting the substrate is set to 0° C. or less.

In one embodiment, the mask is a carbon-containing film or a metal-containing film.

In one embodiment, an etching method includes (a) providing a substrate having a silicon-containing film, and a mask on the silicon-containing film in a chamber of a plasma processing apparatus, and (b) a step of etching the substrate by generating plasma from a processing gas that contains a gas containing H (hydrogen) and F (fluorine), and a phosphorus-containing gas, in the chamber, in which the phosphorus-containing gas is a gas containing P (phosphorus), F (fluorine), and halogen other than F (fluorine) in a molecular structure, a gas containing P (phosphorus), F (fluorine), C (carbon) and H (hydrogen) in a molecular structure, or a gas containing P (phosphorus), F (fluorine) and H (hydrogen) in a molecular structure.

In one embodiment, in the provided etching method, the gas containing H and F includes at least one of HF gas and $C_hH_iF_j$ gas (each of h, i and j is an integer of 1 or more).

In one embodiment, the processing gas further contains a carbon-containing gas.

In one embodiment, an etching method includes: (a) providing a substrate having a silicon-containing film and a mask on the silicon-containing film in a chamber of a plasma processing apparatus; and (b) etching the silicon-containing film by generating plasma that contains HF species, and $PCl_aF_b$ species (a is an integer of 1 or more, b is an integer of 0 or more, and the sum of a and b is an integer of 5 or less) or $PC_cH_dF_e$ species (c is an integer of 0 to 5, and each of d and e is an integer of 1 to 9), from a processing gas.

In one embodiment, the HF species is at least one type of gas selected from the group consisting of HF gas and hydrofluorocarbon gas.

In one embodiment, the HF species is a hydrofluorocarbon gas having two or more carbon atoms.

In one embodiment, the HF species is at least one type of gas selected from the group consisting of HF gas, $CH_2F_2$ gas, $C_3H_2F_4$ gas, $C_3H_2F_6$ gas, and $C_4H_2F_6$ gas.

In one embodiment, a plasma processing system includes a chamber, a processing gas supply, and a controller. In the plasma processing system, the controller executes a control of (a) providing a substrate having a silicon-containing film, and a mask on the silicon-containing film in the chamber, and (b) etching the silicon-containing film by supplying a processing gas containing HF gas, and $PCl_aF_b$ gas (each of a and b is an integer of 1 or more) or $PC_cH_dF_e$ gas (c is an integer of 0 or more, and each of d and e is an integer of 1 or more) into the chamber by the processing gas supply, and generating plasma.

<Configuration Example of Plasma Processing System>

Hereinafter, a configuration example of a plasma processing system will be described. FIG. 1 is a view illustrating a configuration example of a capacitively coupled plasma processing apparatus.

The plasma processing system includes a capacitively coupled plasma processing apparatus 1 and a control unit 2. The capacitively coupled plasma processing apparatus 1 includes a plasma processing chamber 10, a gas supply unit 20, a power supply 30 and an exhaust system 40. The plasma processing apparatus 1 also includes a substrate support 11 and a gas introduction section. The gas introduction section is configured to introduce at least one processing gas into the plasma processing chamber 10. The gas introduction section includes a shower head 13. The substrate support 11 is disposed within the plasma processing chamber 10. The shower head 13 is disposed above the substrate support 11. In one embodiment, the shower head 13 forms at least a part of the ceiling of the plasma processing chamber 10. The plasma processing chamber 10 has a plasma processing space 10s defined by the shower head 13, a side wall 10a of the plasma processing chamber 10 and the substrate support 11. The plasma processing chamber 10 has at least one gas supply port for supplying at least one processing gas to the plasma processing space 10s, and at least one gas exhaust port for exhausting gas from the plasma processing space. The plasma processing chamber 10 is grounded. The shower head 13 and the substrate support 11 are electrically insulated from the housing of the plasma processing chamber 10.

The substrate support 11 includes a body portion 111 and a ring assembly 112. The body portion 111 has a central region 111a for supporting a substrate W, and an annular region 111b for supporting the ring assembly 112. A wafer is an example of the substrate W. The annular region 111b of the body portion 111 surrounds the central region 111a of the body portion 111 in plan view. The substrate W is disposed on the central region 111a of the body portion 111, and the ring assembly 112 is disposed on the annular region 111b of the body portion 111 so as to surround the substrate W on the central region 111a of the body portion 111. Therefore, the central region 111a is also called a substrate support surface for supporting the substrate W, and the annular region 111b is also called a ring support surface for supporting the ring assembly 112.

In one embodiment, the body portion 111 includes a base 1110 and an electrostatic chuck 1111. The base 1110 includes a conductive member. The conductive member of the base 1110 may function as a lower electrode. The electrostatic chuck 1111 is disposed on the base 1110. The electrostatic chuck 1111 includes a ceramic member 1111a and an electrostatic electrode 1111b disposed within the ceramic member 1111a. The ceramic member 1111a has the central region 111a. In one embodiment, the ceramic member 1111a also has the annular region 111b. Another member surrounding the electrostatic chuck 1111, such as an annular electrostatic chuck or an annular insulating member, may have the annular region 111b. In this case, the ring assembly 112 may be disposed on the annular electrostatic chuck or the annular insulating member, or may be disposed on both the electrostatic chuck 1111 and the annular insulating member. Further, at least one RF/DC electrode coupled to a radio frequency (RF) power supply 31 and/or a direct current (DC) power supply 32 to be described below may be disposed within the ceramic member 1111a. In this case, at least one RF/DC electrode functions as the lower electrode. When a bias RF signal and/or a DC signal to be described below is supplied to at least one RF/DC electrode, the RF/DC electrode is also called a bias electrode. The conductive member of the base 1110 and at least one RF/DC electrode may function as a plurality of lower electrodes. Further, the electrostatic electrode 1111b may function as a lower electrode. Therefore, the substrate support 11 includes at least one lower electrode.

The ring assembly 112 includes one or more annular members. In one embodiment, one or more annular members include one or more edge rings and at least one cover ring. The edge ring is made of a conductive material or an insulating material, and the cover ring is made of an insulating material.

The substrate support 11 may also include a temperature control module configured to control at least one of the electrostatic chuck 1111, the ring assembly 112 and the substrate, to a target temperature. The temperature control module may include a heater, a heat transfer medium, and a flow path 1110a, or a combination thereof. A heat transfer fluid such as brine or gas flows through the flow path 1110a. In one embodiment, the flow path 1110a is formed within the base 1110, and one or more heaters are disposed within the ceramic member 1111a of the electrostatic chuck 1111. The substrate support 11 may also include a heat transfer gas supply unit that supplies a heat transfer gas to the gap between the back surface of the substrate W and the central region 111a.

The shower head 13 is configured to introduce at least one processing gas from the gas supply unit 20 into the plasma processing space 10s. The shower head 13 has at least one gas supply port 13a, at least one gas diffusion chamber 13b, and a plurality of gas introduction ports 13c. The processing gas supplied to the gas supply port 13a is introduced into the plasma processing space 10s from the plurality of gas introduction ports 13c through the gas diffusion chamber 13b. The shower head 13 also includes at least one upper electrode. In addition to the shower head 13, the gas introduction section may also include one or more side gas injectors (SGIs) attached to one or more openings formed in the side wall 10a.

The gas supply unit 20 may include at least one gas source 21 and at least one flow controller 22. In one embodiment, the gas supply unit 20 is configured to supply at least one processing gas to the shower head 13 from each corresponding gas source 21 through each corresponding flow controller 22. Each flow controller 22 may include, for example, a mass flow controller or a pressure control-type flow controller. Further, the gas supply unit 20 may include one or more flow modulation devices that modulate the flow rate of at least one processing gas or make a pulse of the flow rate.

The power supply 30 includes the RF power supply 31 coupled to the plasma processing chamber 10 via at least one impedance matching circuit. The RF power supply 31 is configured to supply at least one RF signal (RF power) to at least one lower electrode and/or at least one upper electrode. Accordingly, plasma is formed from at least one processing gas supplied to the plasma processing space 10s. Therefore, the RF power supply 31 may function as at least a part of a plasma generator configured to generate plasma from one or more processing gases in the plasma processing chamber 10. Further, when a bias RF signal is supplied to at least one lower electrode, a bias potential is generated in the substrate W, and ion components in the formed plasma can be drawn into the substrate W.

In one embodiment, the RF power supply 31 includes a first RF generator 31a and a second RF generator 31b. The first RF generator 31a is coupled to at least one lower electrode and/or at least one upper electrode via at least one impedance matching circuit, and is configured to generate a source RF signal (source RF power) for plasma generation. In one embodiment, the source RF signal has a frequency within a range of 10 MHz to 150 MHz. In one embodiment, the first RF generator 31a may be configured to generate source RF signals having different frequencies. One or more generated source RF signals are supplied to at least one lower electrode and/or at least one upper electrode.

The second RF generator 31b is coupled to at least one lower electrode via at least one impedance matching circuit, and is configured to generate a bias RF signal (bias RF power). The frequency of the bias RF signal may be the same as or different from the frequency of the source RF signal. In one embodiment, the bias RF signal has a frequency lower than the frequency of the source RF signal. In one embodiment, the bias RF signal has a frequency within a range of 100 kHz to 60 MHz. In one embodiment, the second RF generator 31b may be configured to generate bias RF signals having different frequencies. One or more generated bias RF signals are supplied to at least one lower electrode. Further, in various embodiments, at least one of the source RF signal and the bias RF signal may be pulsed.

The power supply 30 may also include the DC power supply 32 coupled with the plasma processing chamber 10. The DC power supply 32 includes a first DC generator 32a and a second DC generator 32b. In one embodiment, the first DC generator 32a is connected to at least one lower electrode, and is configured to generate a first DC signal. The generated first bias DC signal is applied to at least one lower electrode. In one embodiment, the second DC generator 32b is connected to at least one upper electrode, and is configured to generate a second DC signal. The generated second DC signal is applied to at least one upper electrode.

In various embodiments, at least one of the first and second DC signals may be pulsed. In this case, a sequence of voltage pulses is applied to at least one lower electrode and/or at least one upper electrode. The voltage pulses may have a pulse waveform of a rectangle, a trapezoid, a triangle or a combination thereof. In one embodiment, a waveform generator that generates a sequence of voltage pulses from DC signals is connected between the first DC generator 32a and at least one lower electrode. Therefore, the first DC generator 32a and the waveform generator constitute a voltage pulse generator. When the second DC generator 32b and the waveform generator constitute the voltage pulse generator, the voltage pulse generator is connected to at least one upper electrode. The voltage pulse may have a positive polarity, or may have a negative polarity. Further, the sequence of voltage pulses may include one or more positive voltage pulses and one or more negative voltage pulses within one period. The first and second DC generators 32a and 32b may be provided in addition to the RF power supply 31, or the first DC generator 32a may be provided instead of the second RF generator 31b.

The exhaust system 40 may be connected to, for example, a gas exhaust port 10e provided at the bottom of the plasma processing chamber 10. The exhaust system 40 may include a pressure regulation valve and a vacuum pump. By the pressure regulation valve, the pressure within the plasma processing space 10s is adjusted. The vacuum pump may include a turbomolecular pump, a dry pump or a combination thereof.

The control unit 2 processes computer-executable instructions that cause the plasma processing apparatus 1 to perform various steps described in the present disclosure. The control unit 2 may be configured to control each element of the plasma processing apparatus 1 so that various steps described herein may be performed. In one embodiment, a part or the entirety of the control unit 2 may be included in the plasma processing apparatus 1. The control unit 2 may include a processor 2a1, a storage 2a2 and a communication interface 2a3. The control unit 2 is implemented by, for example, a computer 2a. The processor 2a1 may be configured to read a program from the storage 2a2, and to execute the read program so as to perform various control operations. This program may be stored in the storage 2a2 in advance, or may be acquired via a medium when necessary. The acquired program is stored in the storage 2a2, and is read from the storage 2a2 and executed by the processor 2a1. The medium may be various storage media readable by the computer 2a, or may be a communication line connected to the communication interface 2a3. The processor 2a1 may be a central processing unit (CPU). The storage 2a2 may include a random access memory (RAM), a read only memory (ROM), a hard disk drive (HDD), a solid state drive (SSD), or a combination thereof. The communication interface 2a3 may communicate with the plasma processing apparatus 1 via a communication line such as a local area network (LAN).

Figure 2:
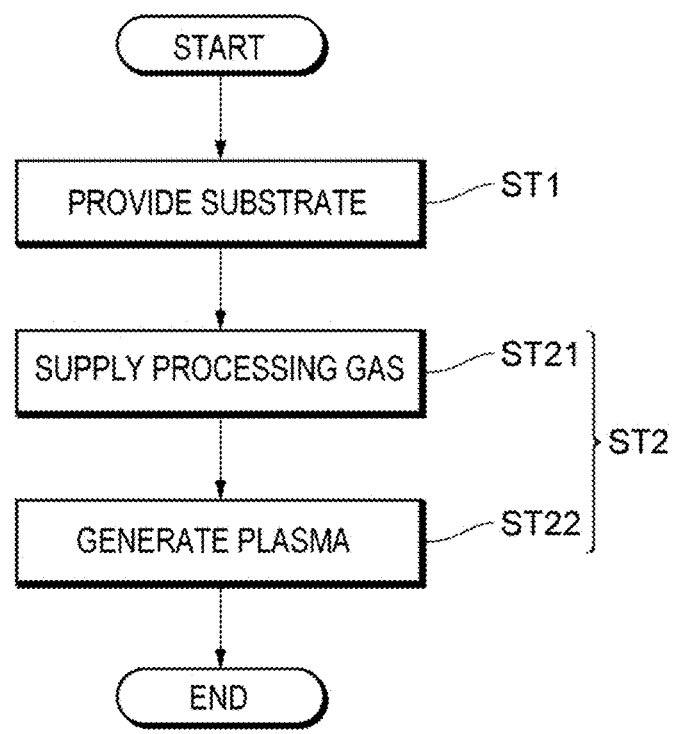
FIG. 2 is a flow chart illustrating the present processing method.

FIG. 2 is a flow chart illustrating an etching method according to one embodiment (hereinafter, also referred to as "the present processing method"). As illustrated in FIG. 2, the present processing method includes a step ST1 of providing a substrate, and a step ST2 of etching a silicon-containing film. The processing in each step may be executed by the plasma processing system illustrated in FIG. 1. Hereinafter, a case where the control unit 2 controls each part of the plasma processing apparatus 1 so as to execute the present processing method on the substrate W will be described as an example.

(Step ST1: Providing Substrate)

In step ST1, the substrate W is provided into the plasma processing space 10s of the plasma processing apparatus 1. The substrate W is provided on the top surface of the substrate support 11, and is held on the substrate support 11 by the electrostatic chuck 1111.

Figure 3:
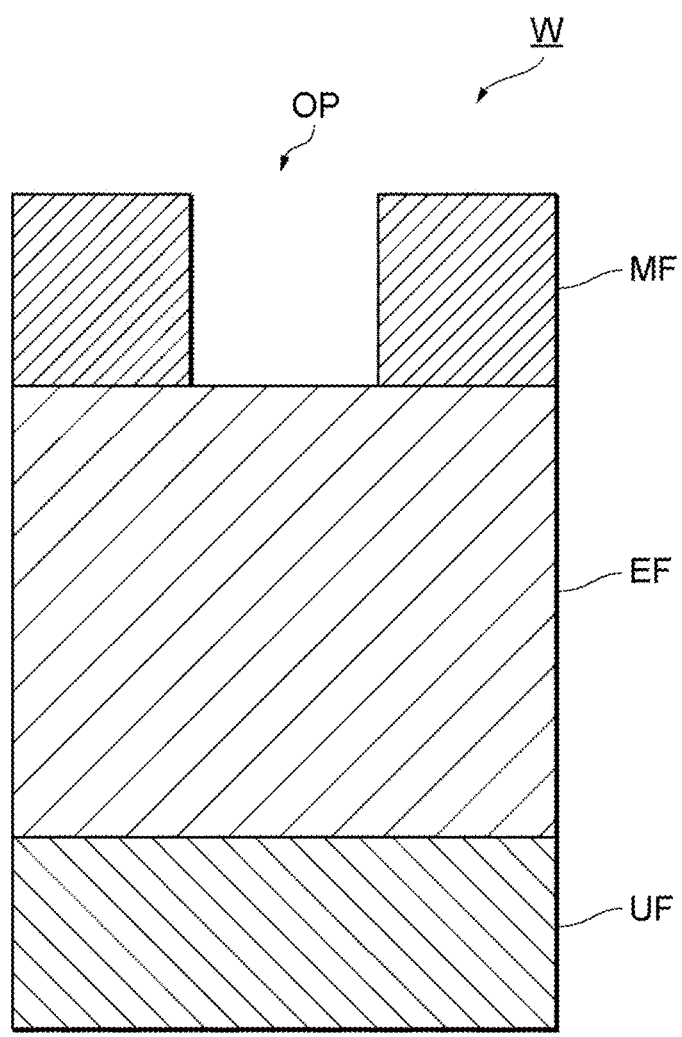
FIG. 3 is a view schematically illustrating an example of a cross-sectional structure of a substrate W provided in step ST1.

FIG. 3 is a view illustrating an example of a cross-sectional structure of the substrate W provided in step ST1. In the substrate W, a silicon-containing film SF and a mask MF are stacked in this order on an underlayer film UF. The substrate W may be used in manufacturing, for example, semiconductor devices including semiconductor memory devices, such as a DRAM and a 3D-NAND flash memory.

The underlayer film UF may be, for example, a silicon wafer or an organic film, a dielectric film, a metal film, or a semiconductor film formed on the silicon wafer. The underlayer film UF may be configured by stacking a plurality of films.

The silicon-containing film SF is a film containing silicon. The silicon-containing film SF may be, for example, a silicon oxide film, a silicon nitride film, a silicon oxynitride film (SiON film), or a silicon-anti reflection carbon (Si-ARC) film. The silicon-containing film SF may be configured by stacking a plurality of films. The silicon-containing film SF may be configured by stacking at least two types of films selected from the group consisting of a silicon oxide film, a silicon nitride film, and a polycrystalline silicon film. For example, the silicon-containing film SF may be configured by alternately stacking a silicon oxide film and a polycrystalline silicon film. Further, for example, the silicon-containing film SF may be configured by alternately stacking a silicon oxide film and a silicon nitride film. Further, for example, the silicon-containing film SF may be configured by alternately stacking a silicon nitride film and a polycrystalline silicon film.

The mask MF is formed on the top surface of the silicon-containing film SF. The mask MF has at least one opening OP. The opening OP is a space surrounded by side surfaces of the mask MF, on the silicon-containing film SF. That is, in FIG. 3, the top surface of the silicon-containing film SF has a portion covered with the mask MF, and a portion exposed through the opening OP.

The opening OP may have any shape in plan view of the substrate W (when the substrate W is viewed in a direction from top to bottom in FIG. 3). The shape may be, for example, a circle, an ellipse, a rectangle, a line or a combination of one or more types of these shapes. The mask MF may have a plurality of openings OP. The openings OP may have hole shapes respectively, and may form array patterns arranged at regular intervals. Further, the openings OP may have linear shapes, respectively, and may form line & space patterns arranged at regular intervals.

The mask MF may be, for example, a carbon-containing film or a metal-containing film. The carbon-containing film may be a spin-on-carbon (SOC) film, an amorphous carbon film, or a photoresist film. The metal-containing film may contain, for example, at least one type selected from the group consisting of tungsten, tungsten carbide, titanium nitride, silicon nitride, and polysilicon. The mask MF may be a single-layer mask composed of one layer, or a multi-layer mask composed of two or more layers.

Each film (the underlayer film UF, the silicon-containing film SF, and the mask MF) forming the substrate W may be individually formed by, for example, a chemical vapor deposition (CVD) method, an atomic layer deposition (ALD) method, or a spin coating method. Each of the films may be a flat film, or may be a film having irregularities. The opening OP of the mask MF may be formed by etching the mask MF. The substrate W may further have another film under the underlayer film UF, and a stacked film of the silicon-containing film SF and the underlayer film UF may function as a multi-layer mask. That is, by using the stacked film of the silicon-containing film SF and the underlayer film UF, as a multi-layer mask, the other film may be etched.

At least a part of the process of forming each film of the substrate W may be performed within a space of the plasma processing chamber 10. In an example, the step of forming the opening OP by etching the mask MF may be executed in the plasma processing chamber 10. That is, the opening OP and an etching film EF to be described below may be continuously etched within the same chamber. Further, in the providing of the substrate, after the entirety or a part of each film of the substrate W is formed in an apparatus or a chamber outside the plasma processing apparatus 1, the substrate W may be carried into the plasma processing space 10s, and may be disposed on the top surface of the substrate support 11.

(Step ST2: Etching Silicon-Containing Film SF)

In step ST2, the silicon-containing film SF is etched. The step ST2 includes a step ST21 of supplying a processing gas and a step ST22 of generating plasma. In step ST21, the processing gas containing various gases is supplied from the gas supply unit 20 into the plasma processing space 10s. Then, in step ST22, plasma is generated from the processing gas, and the silicon-containing film SF is etched.

In step ST2, the temperature of the substrate support 11 is set to a target temperature. The target temperature may be, for example, 0° C. or less. the target temperature may be −10° C. or less, −20° C. or less, −30° C. or less, −40° C. or less, −50° C. or less, −60° C. or less, or −70° C. or less.

Setting the temperature of the substrate support 11 to the target temperature includes measuring the temperature of the substrate support 11, and controlling the temperature of the substrate support 11 by the temperature control module so that the temperature of the substrate support 11 reaches the target temperature, but is not limited to this. In an example, setting the temperature of the substrate support 11 to the target temperature includes: (a) setting the temperature of the substrate W or the temperature of a heat transfer fluid flowing through the flow path 1110a to the target temperature or a temperature different from the target temperature so that the temperature of the substrate support 11 reaches the target temperature; and (b) setting the temperature of the substrate support 11 or the heat transfer fluid flowing through the flow path 1110a to the target temperature or a temperature different from the target temperature so that the temperature of the substrate W reaches the target temperature. Further, "setting" the temperature includes inputting, selecting, or storing the temperature in the control unit 2.

In the present processing method, setting the temperature of the substrate to the target temperature may be performed prior to step ST1. That is, after the temperature of the substrate support 11 is set as the target temperature, the substrate W may be provided to the substrate support 11.

In step ST21, the processing gas is supplied from the gas supply unit 20 into the plasma processing space 10s. The processing gas contains HF gas, and $PCl_aF_b$ gas (a is an integer of 1 or more, b is an integer of 0 or more, and the sum of a and b is an integer of 5 or less) or $PC_cH_dF_e$ gas (each of d and e is an integer of 1 to 5, and c is an integer of 0 to 9).

The $PCl_aF_b$ gas may be, for example, at least one type of gas selected from the group consisting of $PCl_3$ gas, $PClF_2$ gas, $PCl_2F$ gas, and $PCl_2F_3$ gas. Further, the $PCl_aF_b$ gas may be, for example, at least one type of gas selected from the group consisting of $PClF_2$ gas, $PCl_2F$ gas, and $PCl_2F_3$ gas.

The $PC_cH_dF_e$ gas may be, for example, at least one type of gas selected from the group consisting of $PF_2CH_3$ gas, $PF(CH_3)_2$ gas, $PH_2CF_3$ gas, $PH(CF_3)_2$ gas, $PCH_3(CF_3)_2$ gas, $PH_2F$ gas, and $PF_3(CH_3)_2$ gas.

The processing gas may contain a rare gas such as Ar or He, or an inert gas such as nitrogen gas. The processing gas may not contain an inert gas. In the total flow rate of the processing gas excluding the inert gas, the flow rate of the HF gas may be highest. In the total flow rate of the processing gas excluding the inert gas, the flow rate of the HF gas may be 50% by volume or more, 60% by volume or more, 70% by volume or more, or 80% by volume or more.

In the total flow rate of the processing gas excluding the inert gas, the flow rate of the $PCl_aF_b$ gas or the $PC_cH_dF_e$ gas may be 20 vol % or less, 10 vol % or less, or 5 vol % or less.

The processing gas may further include a carbon-containing gas. The carbon-containing gas may be at least one type selected from $C_fF_g$ gas (each of f and g is an integer of 1 or more) and $C_hH_iF_j$ gas (each of h, i and j is an integer of 1 or more). The $C_fF_g$ gas may be at least one type selected from the group consisting of, for example, $CF_4$ gas, $C_2F_6$ gas, $C_2F_4$ gas, $C_3F_8$ gas, and $C_4F_8$ gas. As for the $C_hH_iF_j$ gas, at least one type selected from the group consisting of, for example, $CH_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, and $C_5H_3F_7$ gas may be used. Further, the carbon-containing gas may be a linear one having an unsaturated bond. The linear carbon-containing gas having an unsaturated bond may be, for example, at least one type selected from the group consisting of, for example, $C_3F_6$ (hexafluoropropene) gas, $C_4F_8$ (octafluoro-1-butene, octafluoro-2-butene) gas, $C_3H_2F_4$ (1,3,3,3-tetrafluoropropene) gas, $C_4H_2F_6$ (trans-1,1,1,4,4,4-hexafluoro-2-butene) gas, $C_4F_8O$ (pentafluoroethyltrifluorovinylether) gas, $CF_3COF$ (1,2,2,2-tetrafluoroethane-1-one) gas, $CHF_2COF$ (difluoroacetic acid fluoride) gas, and $COF_2$ (carbonyl fluoride) gas.

The processing gas may further contain at least one type selected from the group consisting of a tungsten-containing gas, a boron-containing gas, and a chlorine-containing gas other than $PCl_aF_b$ gas. For example, $WF_6$ gas or $BCl_3$ gas may be further included.

The processing gas may include a gas capable of generating HF species within the plasma processing chamber 10, instead of the HF gas or together with the HF gas. The HF species includes at least one of gases, radicals, and ions of hydrogen fluoride. The HF species may be generated from at least one type of gas selected from the group consisting of HF gas and hydrofluorocarbon gas. Further, the HF species may be generated from a hydrofluorocarbon gas having two or more carbon atoms. As for the gas capable of generating the HF species, $C_hH_iF_j$ gas (each of h, i and j is an integer of 1 or more), for example, at least one type of gas selected from the group consisting of $CH_2F_2$ gas, $C_3H_2F_4$ gas, $C_3H_2F_6$ gas, $C_3H_3F_5$ gas, $C_4H_2F_6$ gas, $C_4H_5F_5$ gas, $C_4H_2F_8$ gas, $C_5H_2F_6$ gas, $C_5H_2F_{10}$ gas, and $C_5H_3F_7$ gas may be used. As an example, as for the gas capable of generating the HF species, at least one type of gas selected from the group consisting of $CH_2F_2$ gas, $C_3H_2F_4$ gas, $C_3H_2F_6$ gas, and $C_4H_2F_6$ gas is used.

For the processing gas, instead of or in addition to the $PCl_aF_b$ gas or the $PC_cH_dF_e$ gas, $PCl_vF_wC_xH_y$ (each of v, w, x and y is an integer of 1 or more) may be used. Further, for the processing gas, instead of or in addition to the $PCl_aF_b$ gas or the $PC_cH_dF_e$ gas, a gas containing P (phosphorus), F (fluorine) and halogen (e.g., Cl, Br or I) other than F (fluorine) in the molecular structure, a gas containing P (phosphorus), F (fluorine), C (carbon) and H (hydrogen) in the molecular structure, or a gas containing P (phosphorus), F (fluorine) and H (hydrogen) in the molecular structure may be used.

For the processing gas, instead of or in addition to the $PCl_aF_b$ gas or the $PC_cH_dF_e$ gas, a phosphine-based gas may be used. Examples of the phosphine-based gas may include phosphine ($PH_3$), compounds obtained by substituting at least one hydrogen atom of phosphine with an appropriate substituent, and phosphinic acid derivatives.

The substituent substituting for the hydrogen atom of phosphine is not particularly limited, and examples thereof may include halogen atoms such as a fluorine atom, and a chlorine atom; alkyl groups such as a methyl group, an ethyl group, and a propyl group; and hydroxyalkyl groups such as a hydroxymethyl group, a hydroxyethyl group, and a hydroxypropyl group. As an example, a chlorine atom, a methyl group, and a hydroxymethyl group may be exemplified.

Examples of the phosphinic acid derivative may include phosphinic acid ($H_3O_2P$), alkylphosphinic acid (PHO(OH)R), and dialkylphosphinic acid (PO(OH)$R_2$).

As for the phosphine-based gas, for example, at least one type of gas selected from the group consisting of $PCH_3Cl_2$ (dichloro(methyl)phosphine) gas, $P(CH_3)_2Cl$ (chloro(dimethyl)phosphine) gas, $P(HOCH_2)Cl_2$ (dichloro(hydroxymethyl)phosphine) gas, $P(HOCH_2)_2Cl$ (chloro(dihydroxymethyl)phosphine) gas, $P(HOCH_2)(CH_3)_2$ (dimethyl(hydroxymethyl)phosphine) gas, $P(HOCH_2)_2(CH_3)$ (methyl(dihydroxymethyl)phosphine) gas, $P(HOCH_2)_3$ (tris(hydroxymethyl)phosphine) gas, $H_3O_2P$ (phosphinic acid) gas, PHO(OH)($CH_3$) (methylphosphinic acid) gas and PO(OH)($CH_3$)$_2$ (dimethylphosphinic acid) gas may be used.

Figure 4:
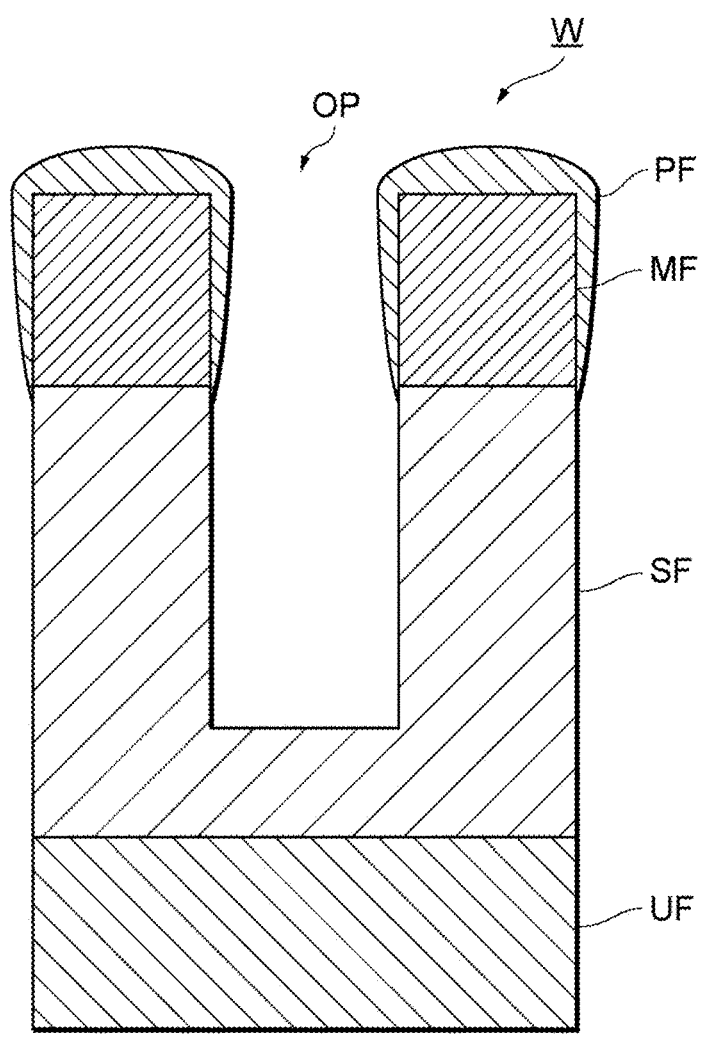
FIG. 4 is a view schematically illustrating an example of a cross-sectional structure of the substrate W during processing of step ST2.

FIG. 4 is a view illustrating an example of a cross-sectional structure of the substrate W during processing of step ST22. In step ST22, the source RF signal (RF power) is supplied from the first RF generator 31a to the lower electrode and/or the upper electrode, and plasma is generated from the processing gas. Further, as a bias signal (power), the bias RF signal is supplied from the second RF generator 31b to the lower electrode, and a bias potential is generated in the substrate. Accordingly, active species such as ions and radicals in the generated plasma are attracted to the substrate W, and the silicon-containing film SF is etched through the opening OP of the mask MF.

As illustrated in FIG. 4, a concave portion corresponding to the shape of the opening OP is formed in the silicon-containing film SF. Active species ($PCl_aF_b$ species, $PC_cH_dF_e$ species) dissociated from the $PCl_aF_b$ gas or the $PC_cH_dF_e$ gas in the processing gas combine with elements included in the mask MF to form a protective film PF. The protective film PF may be deposited on the top surface and side surfaces of the mask MF. The protective film PF may protect the mask MF during etching of the silicon-containing film SF, and may improve the selectivity with respect to the mask MF.

If the function as the protective film is taken into consideration, it is desirable that a binding force with elements constituting the mask MF is strong. Whereas, if the binding force is too strong, the protective film PF is excessively deposited on the mask MF and the opening OP is clogged. In this regard, when the $PCl_aF_b$ gas or the $PC_cH_dF_e$ gas is used, the binding property with elements (e.g., carbon) included in the mask MF is strong as compared to when $PF_3$ gas, $BCl_3$ gas or $BF_3$ gas is used, but the binding property is not as strong as when $PCl_3$ gas is used. That is, the present processing method may suitably balance protection of the mask MF and clogging suppression of the opening OP by including the $PCl_aF_b$ gas or the $PC_cH_dF_e$ gas as the processing gas.

The $PCl_aF_b$ gas or the $PC_cH_dF_e$ gas is a gas in which gases having multiple functions are included in one molecule. For example, the P (phosphorus) species dissociated from the $PCl_aF_b$ gas or the $PC_cH_dF_e$ gas may promote the adsorption of the HF species that is an etchant in the etching of the silicon-containing film SF. For example, the Cl species dissociated from the $PCl_aF_b$ gas or the $PC_cH_dF_e$ gas may contribute to shape adjustment of the silicon-containing film SF. According to the present processing method, since the $PCl_aF_b$ gas or the $PC_cH_dF_e$ gas is used, the partial pressure of the etchant gas (HF gas) may be increased as compared to the case where, for example, two gases, $PF_3$ gas and $Cl_2$ gas, are used to obtain the same effect. Therefore, the present processing method may improve the etching rate of the silicon-containing film SF, and may improve the selectivity with respect to the mask MF.

(Appendix 1)

A device manufacturing method executed in a plasma processing apparatus having a chamber, the device manufacturing method including:
(a) providing a substrate having a silicon-containing film and a mask on the silicon-containing film in the chamber; and
(b) etching the silicon-containing film by generating plasma from a processing gas containing HF gas, and $PCl_aF_b$ gas (a is an integer of 1 or more, b is an integer of 0 or more, and the sum of a and b is an integer of 5 or less) or $PC_cH_dF_e$ gas (c is an integer of 0 to 5, and each of d and e is an integer of 1 to 9), in the chamber.

(Appendix 2)

A program that causes a computer of a plasma processing system including a chamber, a substrate support provided in the chamber, and a plasma generator, to execute a control of
(a) providing a substrate having a silicon-containing film and a mask on the silicon-containing film in the chamber, and
(b) etching the silicon-containing film by generating plasma from a processing gas containing HF gas, and $PCl_aF_b$ gas (a is an integer of 1 or more, b is an integer of 0 or more, and the sum of a and b is an integer of 5 or less) or $PC_cH_dF_e$ gas (c is an integer of 0 to 5, and each of d and e is an integer of 1 to 9), in the chamber.

(Appendix 3)

A storage medium storing the program described in the appendix 2.

(Appendix 4)

An etching gas composition containing HF gas, and $PCl_aF_b$ gas or $PC_cH_dF_e$ gas.

(Appendix 5)

A device manufacturing method executed in a plasma processing apparatus having a chamber, the device manufacturing method including:
(a) providing a substrate having a silicon-containing film and a mask on the silicon-containing film in the chamber; and
(b) etching the substrate by generating plasma from a processing gas that contains a gas containing H (hydrogen) and F (fluorine), and a phosphorus-containing gas, in the chamber, in which the phosphorus-containing gas is a gas containing P (phosphorus), F (fluorine) and halogen other than F (fluorine) in the molecular structure, a gas containing P (phosphorus), F (fluorine), C (carbon) and H (hydrogen) in the molecular structure, or a gas containing P (phosphorus), F (fluorine) and H (hydrogen) in the molecular structure.

(Appendix 6)

A program that causes a computer of a plasma processing system including a chamber, a substrate support provided in the chamber, and a plasma generator, to execute a control of
(a) providing a substrate having a silicon-containing film and a mask on the silicon-containing film in the chamber, and
(b) etching the substrate by generating plasma from a processing gas that contains a gas containing H (hydrogen) and F (fluorine), and a phosphorus-containing gas, in the chamber, in which the phosphorus-containing gas is a gas containing P (phosphorus), F (fluorine) and halogen other than F (fluorine) in the molecular structure, a gas containing P (phosphorus), F (fluorine), C (carbon) and H (hydrogen) in the molecular structure, or a gas containing P (phosphorus), F (fluorine) and H (hydrogen) in the molecular structure.

(Appendix 7)

A storage medium storing the program described in the appendix 6.

(Appendix 8)

An etching gas composition that contains a gas containing H (hydrogen) and F (fluorine), and a gas containing P (phosphorus), F (fluorine) and halogen other than F (fluorine) in the molecular structure, a gas containing P (phosphorus), F (fluorine), C (carbon) and H (hydrogen) in the molecular structure, or a phosphorus-containing gas containing P (phosphorus), F (fluorine) and H (hydrogen) in the molecular structure.

(Appendix 9)

A device manufacturing method executed in a plasma processing apparatus having a chamber, the device manufacturing method including:
(a) providing a substrate having a silicon-containing film and a mask on the silicon-containing film in the chamber; and
(b) etching the silicon-containing film by generating plasma that contains HF species, and $PCl_aF_b$ species (a is an integer of 1 or more, b is an integer of 0 or more, and the sum of a and b is an integer of 5 or less) or $PC_cH_dF_e$ species (c is an integer of 0 to 5, and each of d and e is an integer of 1 to 9), from a processing gas.

(Appendix 10)

A program that causes a computer of a plasma processing system including a chamber, a substrate support provided in the chamber, and a plasma generator, to execute a control of
(a) providing a substrate having a silicon-containing film and a mask on the silicon-containing film into the chamber, and
(b) etching the silicon-containing film by generating plasma that contains HF species, and $PCl_aF_b$ species (a is an integer of 1 or more, b is an integer of 0 or more, and the sum of a and b is an integer of 5 or less) or $PC_cH_dF_e$ species (c is an integer of 0 to 5, and each of d and e is an integer of 1 to 9), from a processing gas.

(Appendix 11)

A storage medium storing the program described in the appendix 10.

According to one embodiment of the present disclosure, it is possible to provide a plasma processing technique of increasing the selectivity with respect to a mask.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. An etching method comprising:
(a) providing a substrate having a silicon-containing film and a mask on the silicon-containing film in a chamber of a plasma process apparatus; and
(b) etching the silicon-containing film by generating plasma from a process gas containing HF gas, and $PCl_aF_b$ gas (a is an integer of 1 or more, b is an integer of 0 or more, and a sum of a and b is an integer of 5 or less) or $PC_cH_dF_e$ gas (c is an integer of 0 to 5, and each of d and e is an integer of 1 to 9), in the chamber.

2. The etching method according to claim 1, wherein each of a and b of the $PCl_aF_b$ gas is an integer of 1 or more.

3. The etching method according to claim 1, wherein the $PCl_aF_b$ gas is at least one selected from the group consisting of $PClF_2$ gas, $PCl_2F$ gas, and $PCl_2F_3$ gas.

4. The etching method according to claim 1, wherein the $PC_cH_dF_e$ gas is at least selected from the group consisting of $PF_2CH_3$ gas, $PF(CH_3)_2$ gas, $PH_2CF_3$ gas, $PH(CF_3)_2$ gas, $PCH_3(CF_3)_2$ gas, $PH_2F$ gas, and $PF_3(CH_3)_2$ gas.

5. The etching method according to claim 1, wherein in (b), a flow rate of the HF gas is highest in the process gas supplied into the chamber, excluding an inert gas.

6. The etching method according to claim 5, wherein the flow rate of the HF gas is 50 vol % or more in a total flow rate of the process gas excluding the inert gas.

7. The etching method according to claim 1, wherein a flow rate of the $PCl_aF_b$ gas or the $PC_cH_dF_e$ gas is 20 vol % or less in a total flow rate of the process gas excluding an inert gas.

8. The etching method according to claim 1, wherein the process gas further contains $C_fF_g$ gas (each off and g is an integer of 1 or more).

9. The etching method according to claim 1, wherein the process gas further contains $C_hH_iF_j$ gas (each of h, i and j is an integer of 1 or more).

10. The etching method according to claim 1, wherein the process gas further contains $WF_6$ gas and/or $BCl_3$ gas.

11. The etching method according to claim 1, wherein in (b), a temperature of a substrate support supporting the substrate is set to 0° C. or less.

12. The etching method according to claim 1, wherein the mask is a carbon-containing film or a metal-containing film.

13. An etching method comprising:
   (a) providing a substrate having a silicon-containing film and a mask on the silicon-containing film in a chamber of a plasma process apparatus; and
   (b) etching the substrate by generating plasma from a process gas that contains a gas containing H (hydrogen) and F (fluorine), and a phosphorus-containing gas, in the chamber, the phosphorus-containing gas being a gas containing P (phosphorus), F (fluorine), and halogen other than F (fluorine) in a molecular structure, a gas containing P (phosphorus), F (fluorine), C (carbon), and H (hydrogen) in the molecular structure, or a gas containing P (phosphorus), F (fluorine), and H (hydrogen) in the molecular structure.

14. The etching method according to claim 13, wherein the gas containing H and F includes at least one of HF gas and $C_hH_iF_j$ gas (each of h, i and j is an integer of 1 or more).

15. The etching method according to claim 13, wherein the process gas further contains a carbon-containing gas.

16. An etching method comprising:
   (a) providing a substrate having a silicon-containing film and a mask on the silicon-containing film in a chamber of a plasma process apparatus; and
   (b) etching the silicon-containing film by generating plasma that contains HF species, and $PCl_aF_b$ species (a is an integer of 1 or more, b is an integer of 0 or more, and the sum of a and b is an integer of 5 or less) or $PC_cH_dF_e$ species (c is an integer of 0 to 5, and each of d and e is an integer of 1 to 9), from a process gas.

17. The etching method according to claim 16, wherein the HF species is generated from at least one type of gas selected from the group consisting of HF gas and hydrofluorocarbon gas.

18. The etching method according to claim 16, wherein the HF species is generated from hydrofluorocarbon gas having two or more carbon atoms.

19. The etching method according to claim 16, wherein the HF species is generated from at least one type of gas selected from the group consisting of HF gas, $CH_2F_2$ gas, $C_3H_2F_4$ gas, $C_3H_2F_6$ gas, and $C_4H_2F_6$ gas.

* * * * *